United States Patent [19]

Grabbe et al.

[11] 4,195,193

[45] Mar. 25, 1980

[54] LEAD FRAME AND CHIP CARRIER HOUSING

[75] Inventors: Dimitry Grabbe, Lisbon Falls, Me.; Ronald Patterson, Dauphin, Pa.

[73] Assignee: AMP Incorporated, Harrisburg, Pa.

[21] Appl. No.: 14,397

[22] Filed: Feb. 23, 1979

[51] Int. Cl.² .............................................. H05K 1/04
[52] U.S. Cl. ................................ 174/52 FP; 357/70; 361/421
[58] Field of Search ............. 174/52 FP; 29/589, 591; 357/70; 361/421

[56] References Cited

U.S. PATENT DOCUMENTS

| | | | |
|---|---|---|---|
| 3,676,748 | 7/1972 | Kobayashi et al. | |
| 3,930,114 | 12/1975 | Hodge | 174/52 FP |
| 4,079,511 | 3/1978 | Grabbe | 174/52 FP X |
| 4,105,861 | 8/1978 | Hascoe | 174/52 FP |
| 4,142,287 | 3/1979 | Grabbe | 174/52 FP X |

Primary Examiner—B. A. Reynolds
Assistant Examiner—D. A. Tone
Attorney, Agent, or Firm—Frederick W. Raring

[57] ABSTRACT

A lead frame and chip carrier housing are disclosed which can be used in packaging integrated circuit chips of a range of sizes and requiring varying numbers of leads in the lead frame. The lead frame comprises a centrally located square support portion having simple leads extending from its side edges and having composite leads extending from its corners. Each of the composite leads comprises a trunk lead and branch leads which extend from the side edges of the trunk lead. A relatively small integrated circuit chip can be used with the lead frame by removing only the support portion, locating the chip adjacent to the opening and connecting the simple leads only to the terminal areas of the chip. The lead frame can be used with larger chips having greater numbers of terminal pads by removing the support portion, removing inner end portions of the simple leads, and removing inner end portions of the composite leads so that some or all of the branch leads become available for establishing electrical connections to the chip. The chip carrier housing comprises an open frame member of insulating material molded onto intermediate portions of all of the leads. The inner ends of the leads are imbedded in a thin web which extends from the molded frame inwardly towards the center of the lead frame. Portions of this web are removed when the central opening is formed in the lead frame for the chip.

16 Claims, 12 Drawing Figures

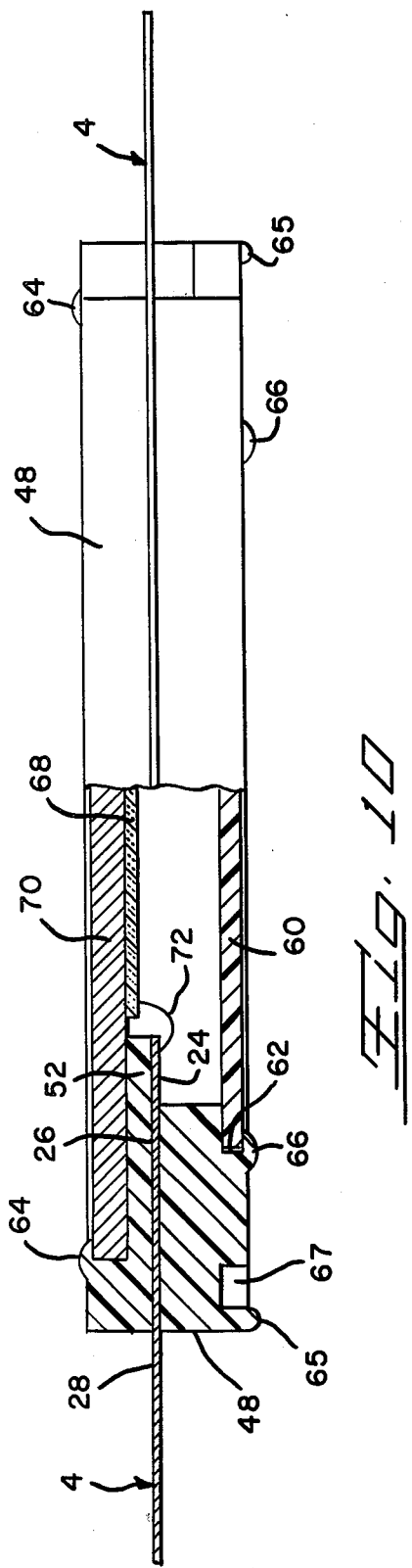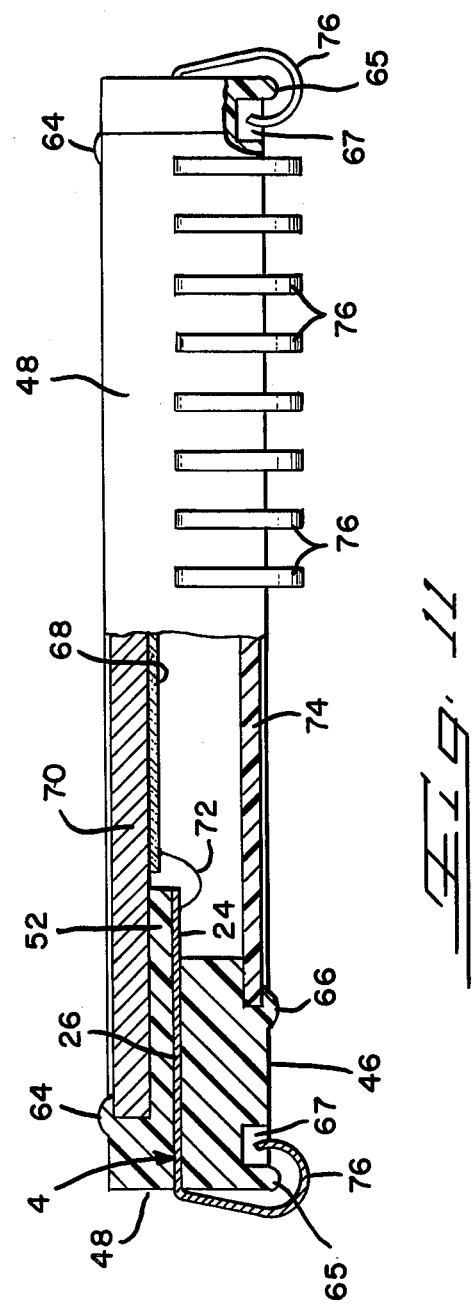

LEAD FRAME AND CHIP CARRIER HOUSING

FIELD OF THE INVENTION

This invention relates to lead frames and lead frames having chip carrier housings molded thereon for use in packaging integrated circuit chips.

BACKGROUND OF THE INVENTION

Integrated circuits are being produced in large numbers in the form of flat chips which are usually square and which have terminal areas or terminal pads located on one surface thereof, usually along the side edges of the chip. These chips are being produced in several sizes and having varying numbers of terminal areas. When a chip is packaged in a chip carrier, it is of course necessary to establish electrical connections to each of the terminal areas on the chip and to provide conductors extending from the chip to the edge of the chip carrier so that the chip can be connected to further circuitry.

In accordance with conventional packaging techniques, it is necessary to provide a lead frame for each chip size and terminal area requirement. Thus, it is necessary to provide different lead frames for each of the many sizes of chips being supplied to the industry. The requirement of a specifically tailored lead frame and chip carrier for each size of chip is obviously a burdensome inconvenience to the electronic packaging industry. Clearly, substantial economies could be achieved if a single standard lead frame and chip carrier housing could be used with chips in a range of sizes and chips having a range of numbers of terminal areas of pads thereon. The present invention is directed to the achievement of a lead frame and a chip carrier which can in fact be used in the packaging of chips of varying size and having varying numbers of terminal areas or terminal pads thereon.

A lead frame in accordance with the invention comprises a support portion located at the geometric center of the lead frame and leads which are integral with, and extend from, the support portion in all directions. The leads are of two classes, simple and composite, the simple leads comprising a single very narror strip of metal which extends from one of the edges of the central support portion. Each composite lead comprises a trunk lead and branch leads. The trunk end of each composite lead extends from one corner of the support postion of the lead frame and the branch leads extend from the side edges of the trunk lead at spaced intervals. The simple leads and the branch leads have a configuration such that their intermediate portions and outer ends form a symmetrical radiating pattern with reference to the central support portion of the lead frame.

The chip carrier housing comprises a frame-like structure which is molded into intermediate portions of all of the leads in surrounding relationship to the central support portion. The molded housing has an integral thin web which extends inwardly to the central support portion and which serves to support the leads. When an integrated circuit chip of a relatively small size and having a mimimum number of terminal pads on its surface is to be packaged in accordance with the invention, the central support portion is removed along with the web material which in supporting relationship to the central support portion, the chip is placed in the resulting opening and the simple leads only are connected to the terminal areas or pads of the chip. If a larger chip having a greater number of terminal pads is to be packaged, the inner end portions of the simple leads are removed and a portion of each trunk lead is removed. The removal of a portion of each trunk lead makes available some of the branch leads for establishing electrical connections to the chip. The larger the opening in the center of the lead frame is made, the greater the number of branch leads which become available and a range of sizes and types of integrated circuit chips can therefore be accommodated with a single lead frame and chip carrier housing.

DESCRIPTION OF THE DRAWINGS

FIG. 7 is a veiw taken along the lines 7—7 of FIG. 6.

FIG. 8 is a view taken along the lines 8—8 of FIG. 7.

FIG. 10 is a view taken along lines 10—10 of FIG. 9.

FIG. 11 is a side view of the chip carrier assembly after removal from the strip and forming of the outer ends of the leads.

PRACTICE OF THE INVENTION

Figure 1:
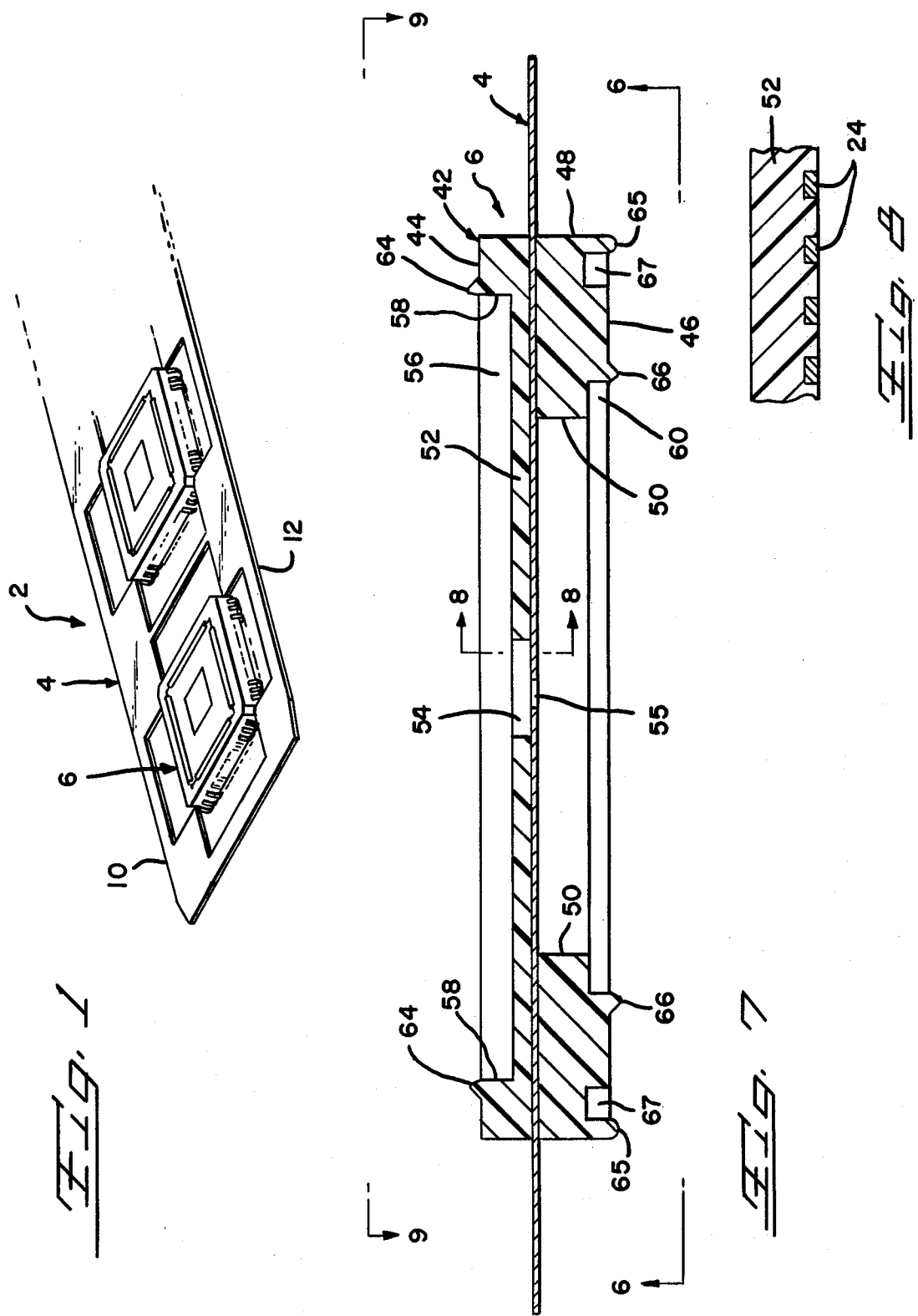
FIG. 1 is a perspective view of a section of strip in accordance with the invention comprising a strip of lead frames having chip carrier housings molded thereon in surrounding relationship to each lead frame.

FIG. 1 shows a continuous strip 2 in accordance with the invention comprising a lead frame strip 4 and chip carrier housings 6 molded onto the lead frame strip in surrounding relationship to each lead frame. In the description which follows, an individual lead frame, FIG. 2, is first described in detail and this description is followed by a description of the chip carrier housing and the manner in which the chip can be packaged in the housing and the terminal areas of the chip connected to the leads.

Figure 2:
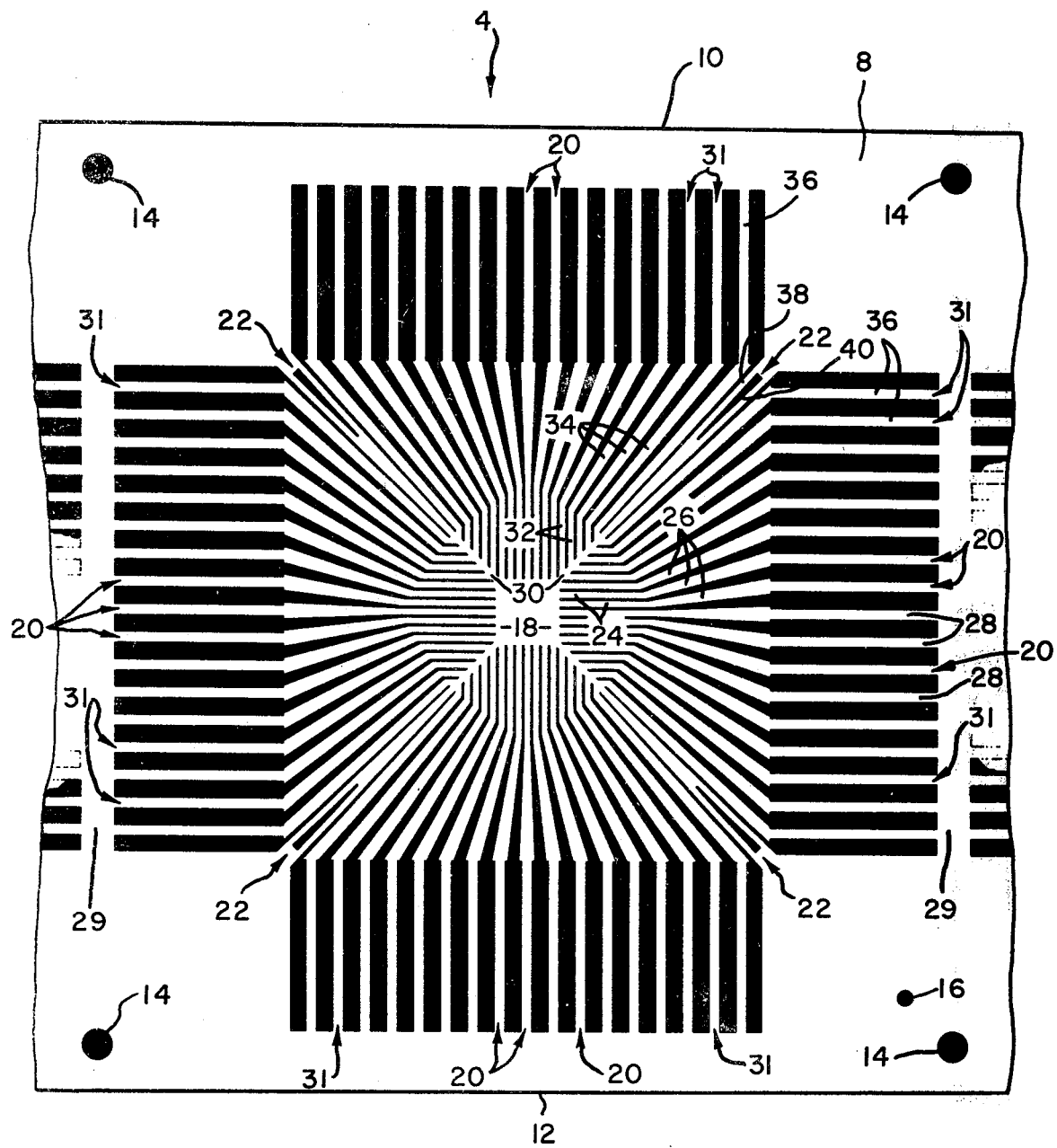
FIG. 2 is a plan view, prepared from a precise photographic negative, of a lead frame in accordance with the invention.

FIG. 2 is a photographically reproduced negative of the type used for manufacturing lead frames by photoresist and etching processes. The black areas in FIG. 2, therefore, represent openings in the metal strip 8 and the leads are represented by the extremely thin metal strips which radiate from the center 18 of the lead frame.

The lead frame strip 4 comprises a continuous strip of conductive metal 8 having parallel side edges 10, 12 and provided with pilot holes 14 at regularly spaced intervals adjacent to the side edges. In addition, an index hole 16 may be provided at pre-determined location adjacent to each lead frame for the purpose of orienting the lead frame and the chip carrier housing during manufacture of chip carrier assemblies.

The lead frame shown in FIG. 2 comprises a central support member 18 which is square in the disclosed embodiment located at the center of the lead frame and leads 20,22 extending from this support member. The leads 20 are classified as simple leads for the reason that each of these leads 20 comprises a single band or strip of metal extending from one edge of the support member 18. Each simple lead 20 has an inner end portion 24 which extends normally from one edge of the support member 18, an intermediate portion 26, and an outer end portion 28. The intermediate portions 26 diverge from each other and the outer end portions 28 extend parallel to each other at spaced intervals. The lead frame of FIG. 2 is symmetrical about the vertical and horizontal axis, as viewed in this figure. Each lead frame in the strip is separated from adjacent lead frames by a narrow transversely extending portion 29 of the stock metal as shown in FIG. 2.

Each of the composite leads generally indicated at 22 comprises a trunk lead 30 which extends from a corner of the central support member 18 at an angle of 45 degrees to the inner ends 24 of the adjacent simple leads. Each composite lead 22 further comprises a plurality of branch leads generally indicated at 31. Each branch lead has an inner end portion 32 which extends from one side edge of the associated trunk 30 and parallel to the adjacent inner ends 24 of the immediately adjacent simple leads. The branch leads further have intermediate portions 34 which form part of the intermediate radiating lead pattern and outer end portions 36 which extend parallel to the outer end portions 28 of the simple leads. The outer ends 38 of the composite leads are provided with triangular openings 40 which provide an improved interlock between the chip carrier housing and the lead frame when the housing is molded onto the lead frame.

The particular embodiment of the invention shown in FIG. 2 has a total of twenty-eight simple leads, seven simple leads extending from each of the side edges of the support portion 18. Each of the four composite leads has a total of ten branch leads, 31, extending therefrom, five branch leads extending from each of its side edges. As will be shown below, by virtue of this arrangement, the lead frame of FIG. 2 can be used in the packaging of chips requiring twenty-eight leads or less and can be used by chips requiring a total of sixty-eight leads as well as chips requiring intermediate numbers of leads.

Figure 3:
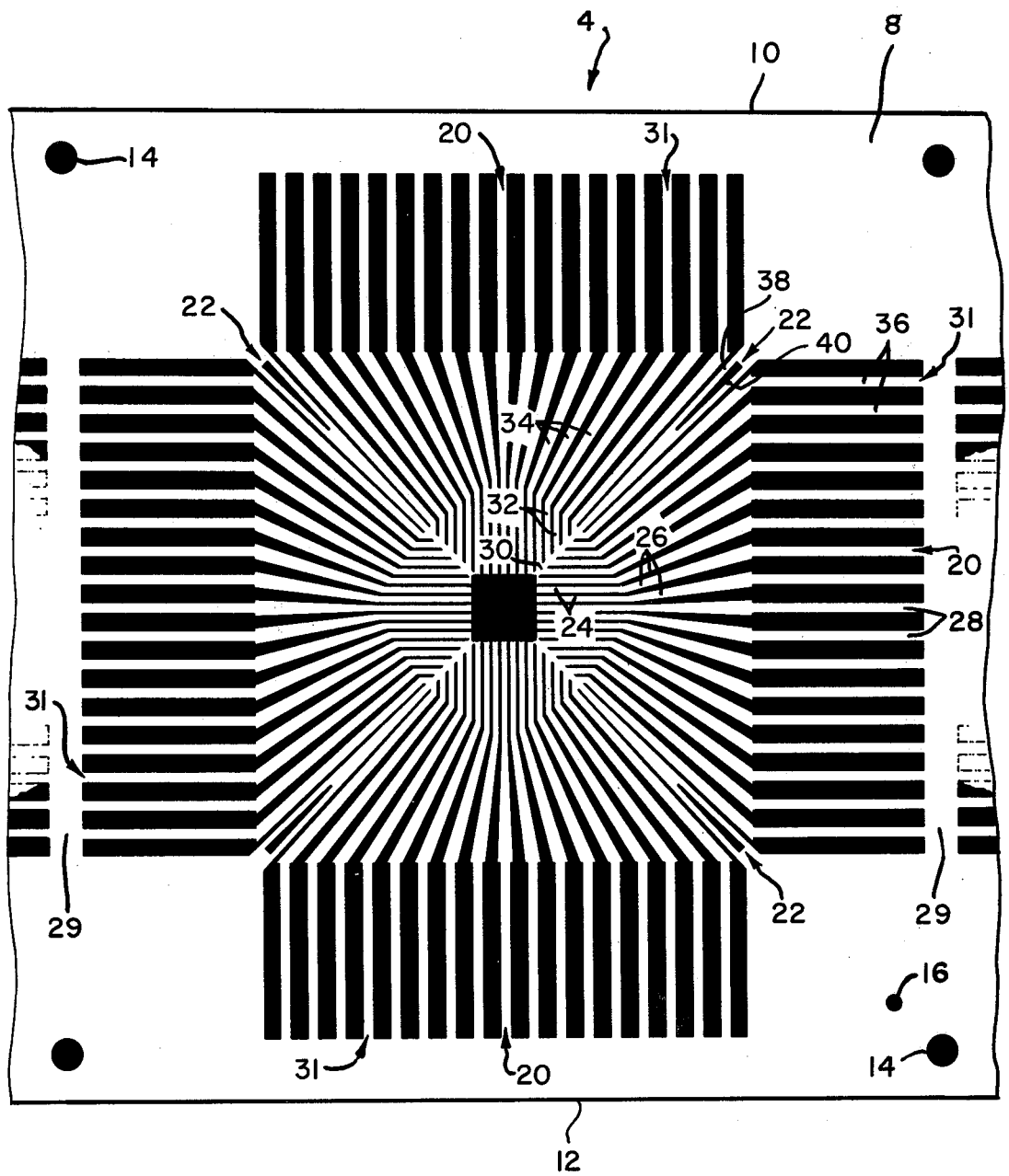
FIGS. 3-5 are views similar to FIG. 2 but illustrating the manner in which chips of varying sizes and requiring varying numbers of leads can be accommodated by the lead frame of FIG. 2.
Figure 4:
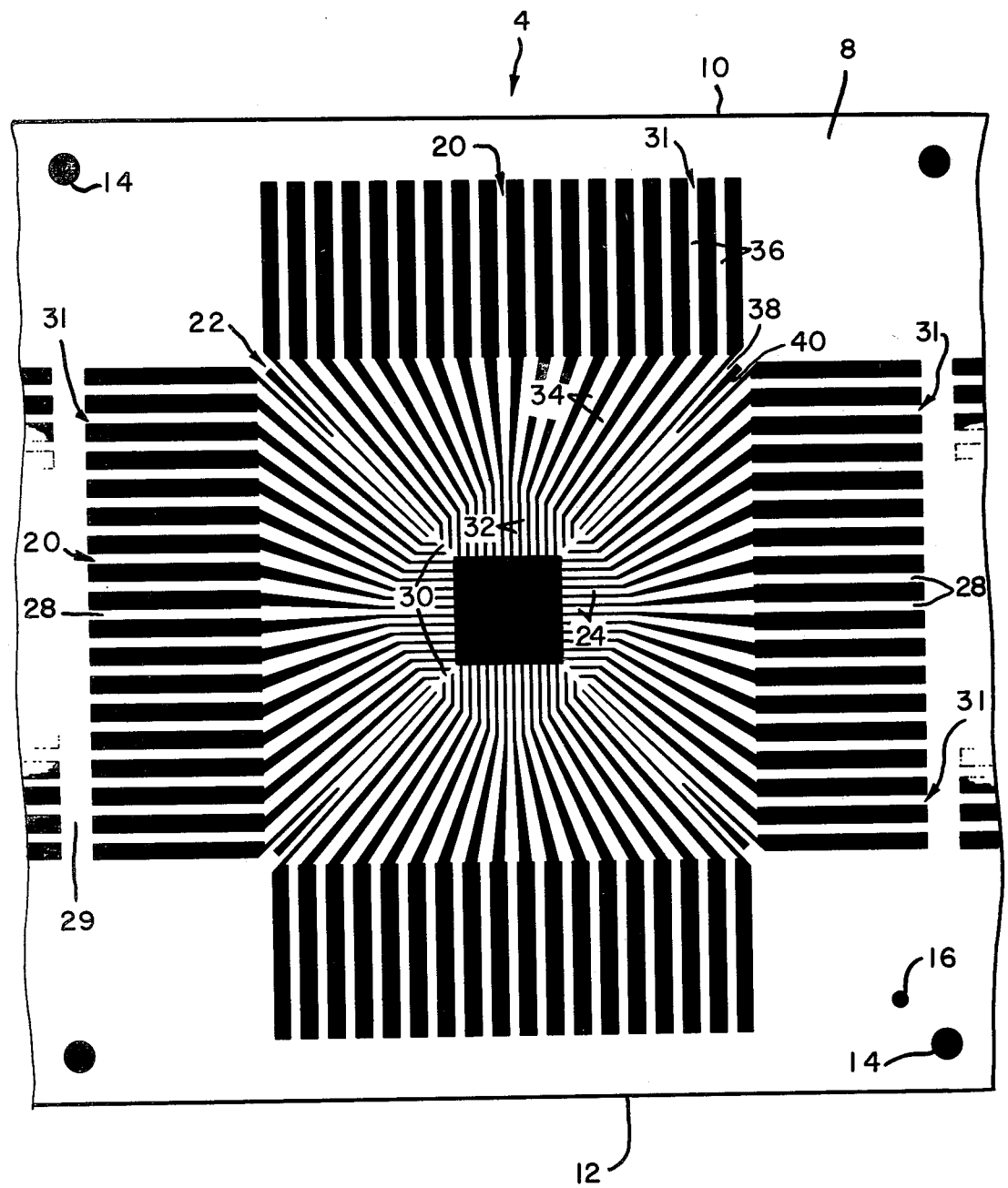
Figure 5:
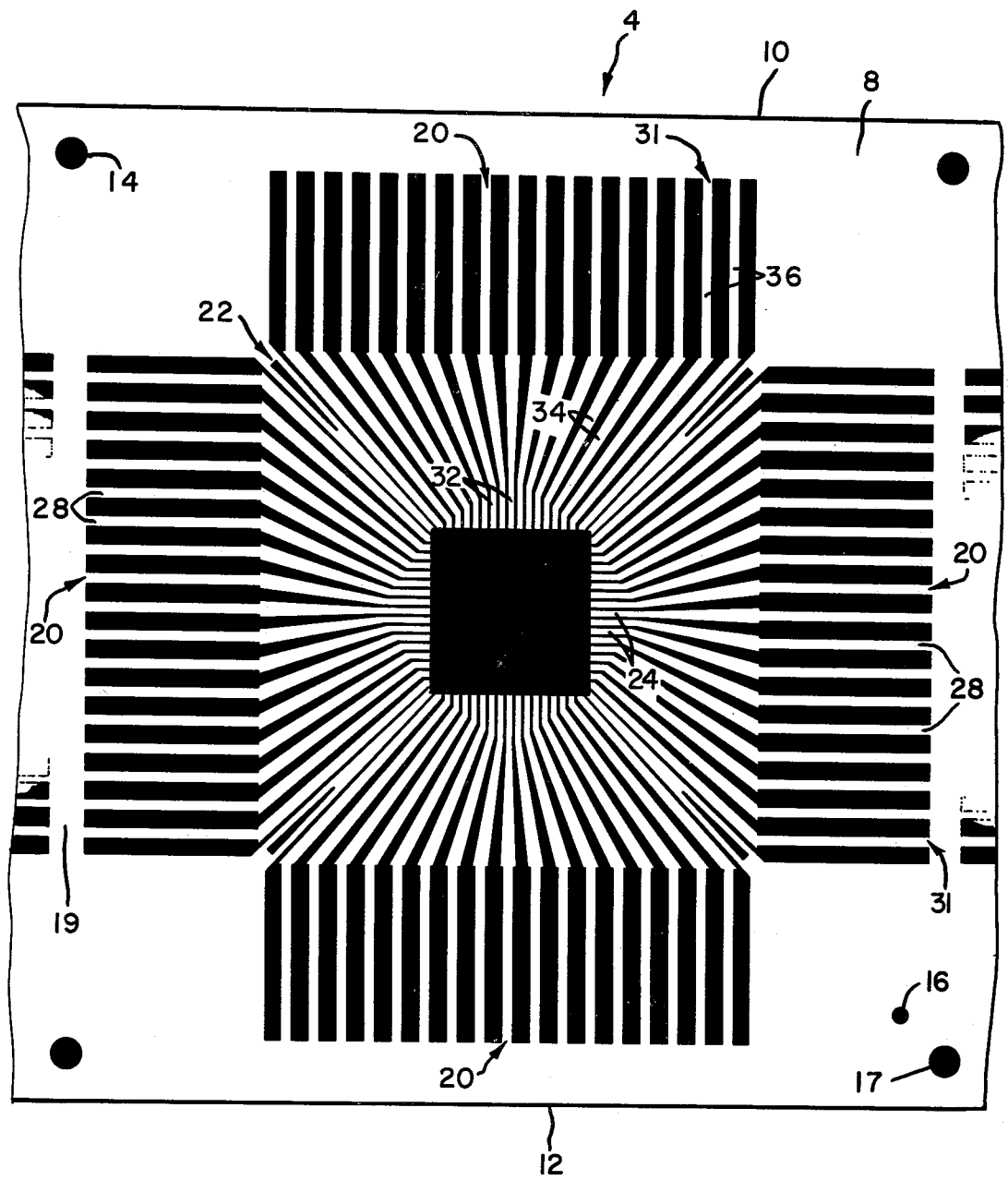

In the use of the lead frame of FIG. 2, an opening is provided in the center of lead frame of a size which will depend upon the physical dimensions of the chip and the number of leads required for the chip. If the lead frame is used in packaging a relatively small chip which requires only twenty-eight leads, the center support member 18 only is removed from the lead frame as shown in FIG. 3, and the seven simple leads 20 which surround this opening are connected to the terminal areas of the chip. If it is desired to produce a chip carrier assembly containing a chip of a larger size requiring forty-four leads, an opening as shown in FIG. 4 is provided in the center of the lead frame by removing the center support member 18, portions of the inner ends 24 of the simple leads, and a portion of each trunk lead 30 which is adjacent to the support member 18. Upon removal of these inner end portions of the trunk leads 30, some of the branch leads become separated from the trunk lead and can be used to establish electrical connections to the chip. If a relatively large integrated circuit chip is being packaged in a chip carrier assembly, an opening as shown in FIG. 5 is provided by removal of central portions of the lead frame, including the inner ends of the trunk lead 30. An opening of this size renders all of the branch leads 31 available for establishing connections to the IC chip so that a total of sixty-eight leads (forty branch leads and twenty-eight simple leads) are provided for the chip.

It should be explained at this juncture that the lead frame as described above can be used with chip carrier housings of many different types and can be used in any desired manufacturing processes for producing chip carrier assemblies. There will now be described a specific pre-molded housing in accordance with the principles of the instant invention which also permits the accommodation of chips of varying sizes.

Figure 6:
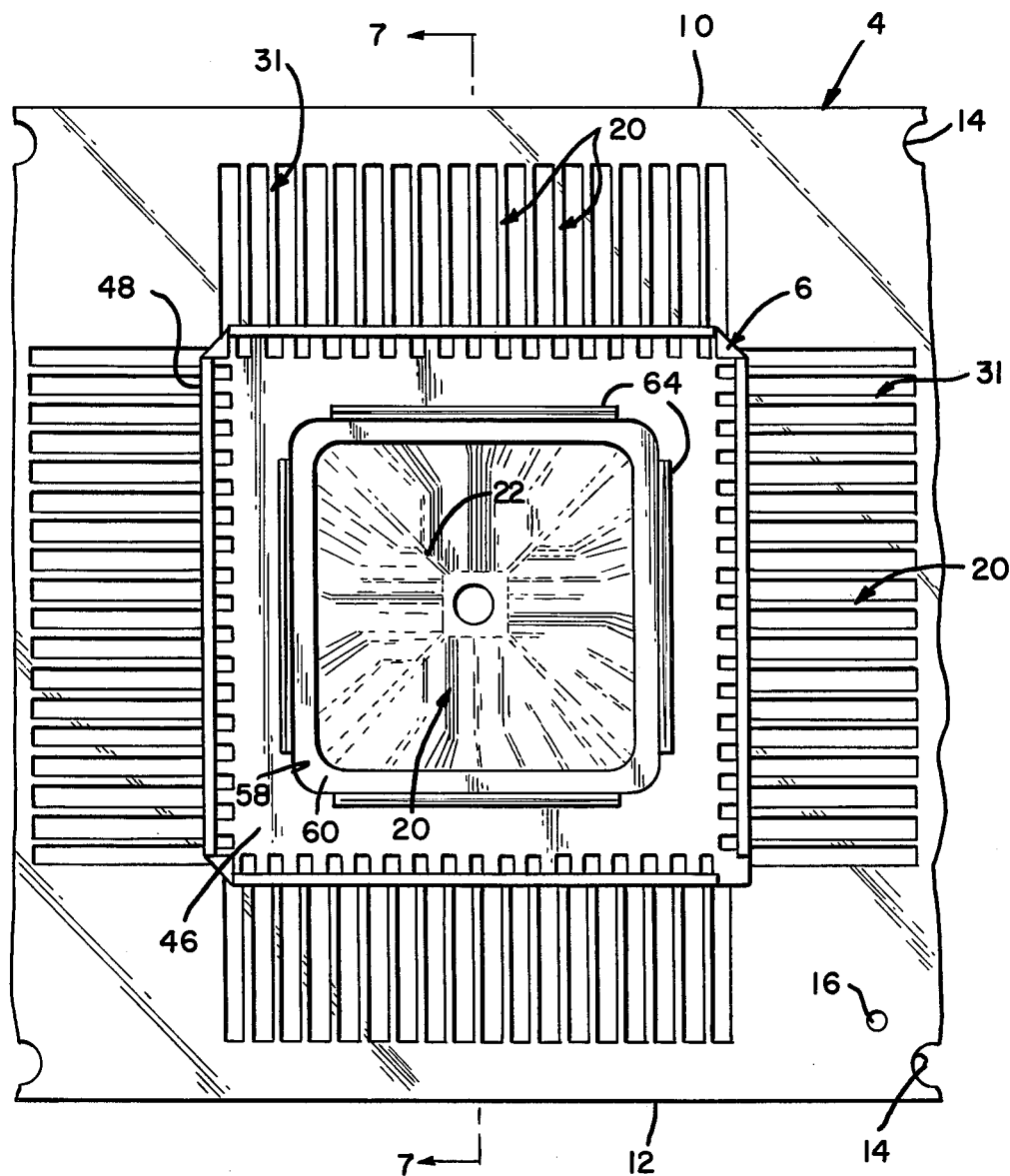
FIG. 6 is a plan view looking in the direction of the arrors 6—6 of FIG. 7 of a short section of strip showing a chip carrier housing molded onto the strip in surrounding relationship to a lead frame.
Figure 9:
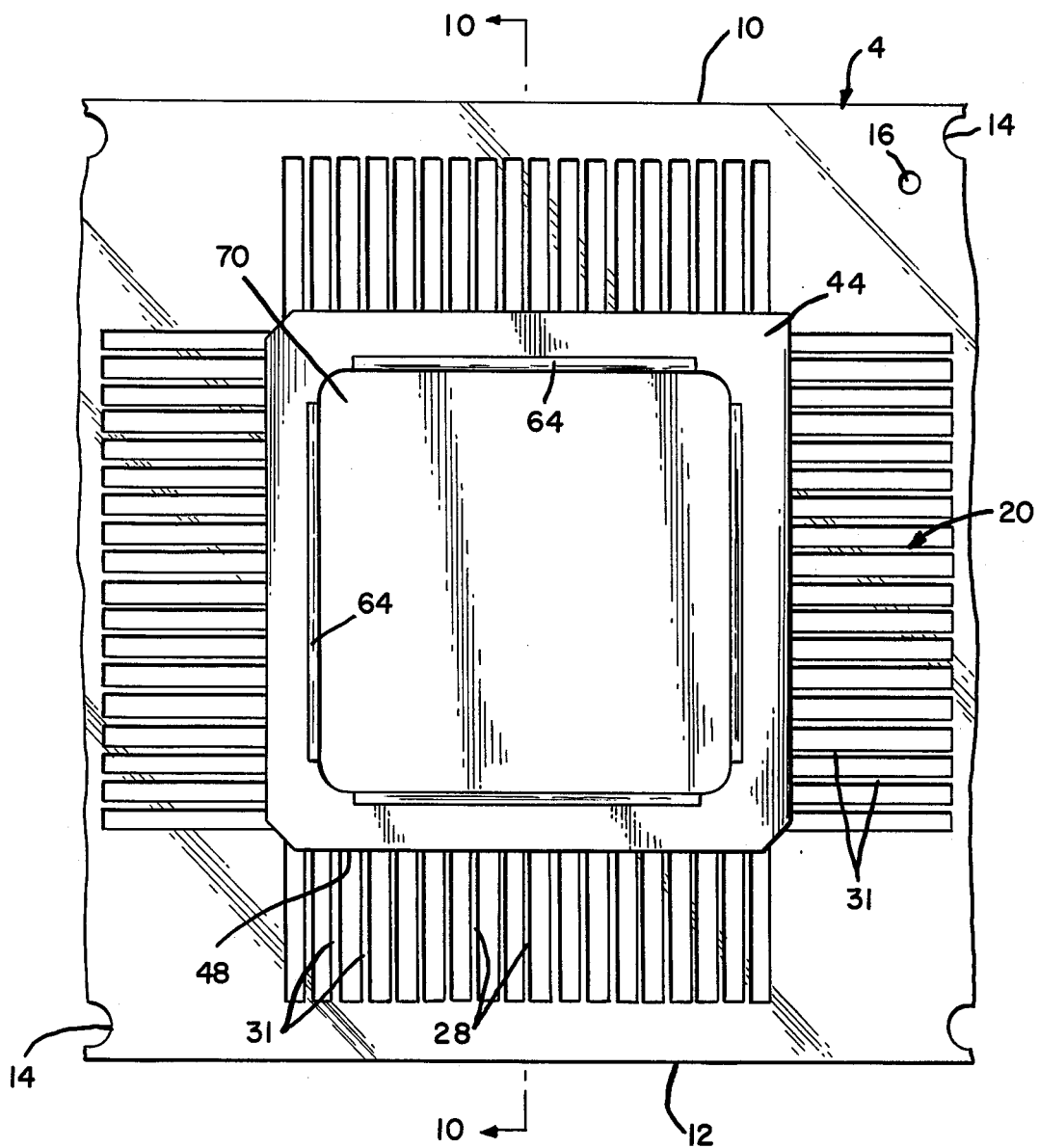
FIG. 9 is a top plan view of a strip showing a chip carrier assembly containing an integrated circuit chip on a lead frame.

The housings 6 (FIG. 6) are molded onto the strip 4 by a suitable injection molding apparatus and may be of any suitable thermoplastic material, such as polyphenylnene sulfide resin. Suitable filling materials, such as glass fibers, can be used with the resin to provide improved hardness or other desired characteristics in the housing. Resins of this general class are available from a number of sources, for example, from Phillips Petroleum Company of Bartlesville, Oklahoma, under the trademark RYTON. Other materials having similar physical characteristics can be used.

Each housing comprises a square frame-like structure 42 which surrounds the center of the lead frame and which extends beyond both surfaces of the metal strip. Each housing has oppositely directed faces 44, 46, external sidewalls 48 and internal sidewalls 50. A relatively thin web 52 extends inwardly from the internal sidewalls towards the center of the lead frame and an opening 54 is provided in this web which is centrally located with respect to both support portions 18 of the lead frame. A small central opening 55 is also provided in the lead frame as shown, the openings 54,55 being by the cores used in the molding process. The inner ends of the leads are embedded in the web 52 but their downwardly facing surfaces are exposed as shown in FIGS. 8 and 10 and the intermediate portions of the leads are totally imbedded in the sidewalls of the frame-like structure as clearly shown in FIG. 7.

A shallow depression 56 extends inwardly from the face 44 so that the sidewall 58 is outwardly displaced with respect to the intermediate sidewall 50. A depression 60 of somewhat smaller size is provided in the face 46 in surrounding relationship to the central opening and this depression has sidewall portion 62 as shown. Upstanding lips 64 are provided on the faces 44, 46 in enclosing relationship to the depressions 56, 60, these lips being deformed during assembly of the chip carrier assembly as will be described below. Finally, shallow recesses 67 are provided in the downwardly facing surface 46 adjacent to the external sidewalls 48 and projecting lips 65 are provided adjacent to each recess. These recesses 67 receive the ends of the leads after forming as will also be described below.

Figure 12:
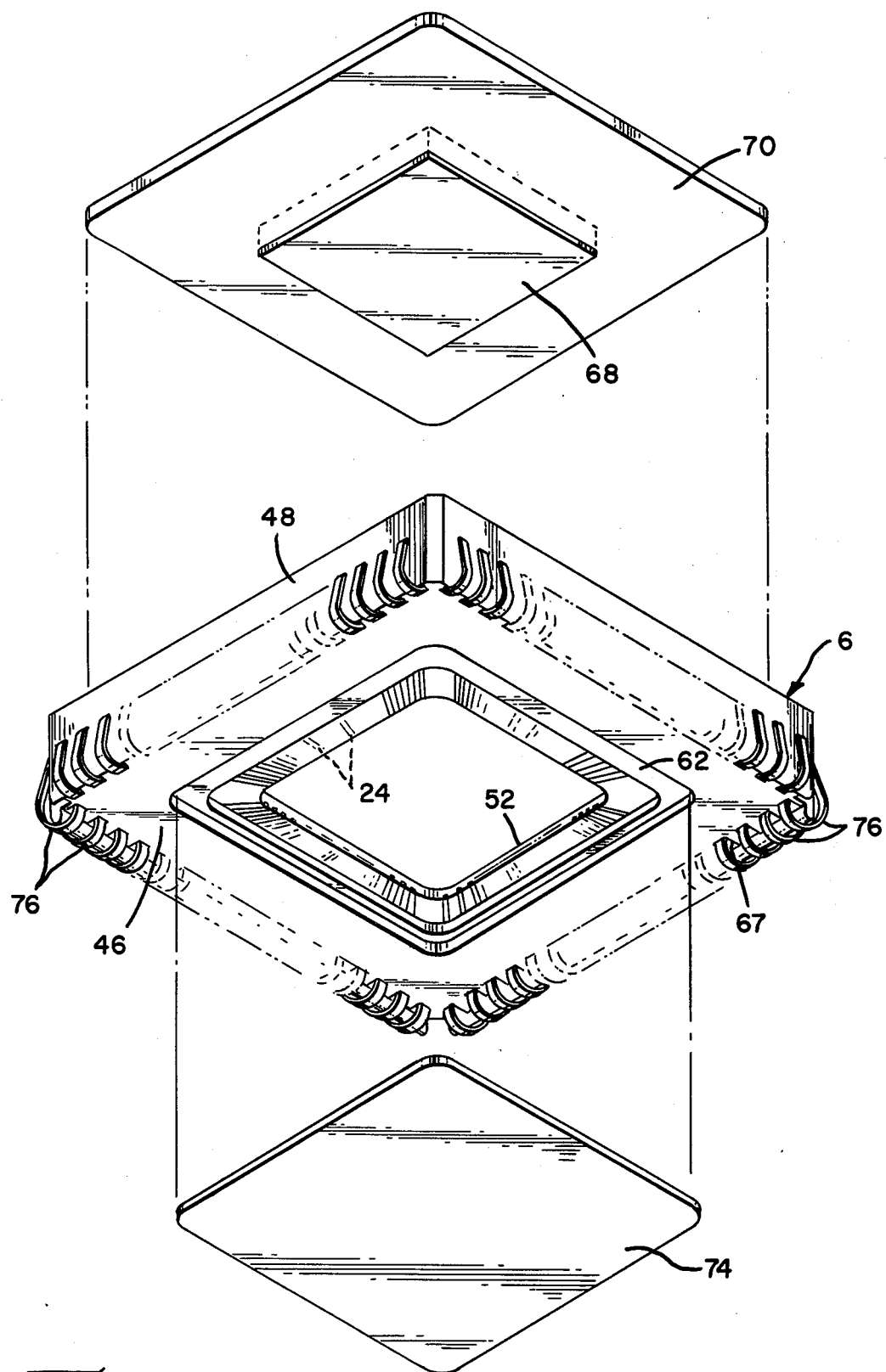
FIG. 12 is an exploded view of the chip carrier assembly.

In the manufacture of chip carrier assemblies in accordance with the instant invention, a portion of the web 52 along with the central support member 18 of the lead frame is removed by a suitable punch and die to provide an enlarged opening in the web as shown in FIG. 12. The opening in FIG. 12 will provide the maximum number of leads for the chip 68 and is, as shown, dimensioned to receive the chip in a manner such that the ends of the leads of the lead frame will be relatively close to the surface of the chip. The chip 68 is bonded to a suitable head sink 70 and the heat sink, which is dimensioned to be received in the recess 56, is then positioned in the recess as shown in FIG. 10. The lips 64 are thermally reformed, as shown in FIG. 10 so that they extend over marginal portions of the heat sink and retain it in the chip carrier housing. The terminal areas of the chip are then electrically connected in any suitable way to the ends of the leads, FIGS. 10 and 11 showing conventional wire bond connections 72 extending from the chip to the leads. It will be noted that the chip can be positioned immediately adjacent to the leads of the lead frame and the extremely fine wires 72 will therefore be extremely short.

The manufacturing process is completed by filling the central opening of the housing with a suitable material such as silicone material, mounting a bottom closure member 74 in the depression 60, and forming the lips 64 on the face 46 over the surface of the closure member to retain it in place.

The operations described above can be carried out while the outer ends of the leads are integral with the metal strip 8 of the lead frame and after these operations have been carried out, the leads are severed from the metal strip and formed towards the face 46, their ends being reversely bent as shown at 76 so that they are received in the openings 67 as shown in FIG. 11. The chip carrier assembly can then be plugged into a suitable chip carrier receptacle of the general type described in U.S. Pat. No. 4,079,511 or they can be formed in a different manner and soldered to a circuit board.

The advantageous features of the chip carrier housing 6 can be used with lead frames other than the specific lead frame shown in FIG. 2. For example, a lead frame having only simple leads extending therefrom and which does not therefore permit use of chips having varying numbers of terminal pads, can be used in conjunction with the housing as described above. The lead frame strip having housings thereon could then be used for chips of varying sizes having the same numbers of terminal pads.

Lead frames in accordance with the invention can be used for chips of other than the square configuration shown in the drawing. Square IC chips are widely used but chips need not be produced in a square configuration and a lead frame in accordance with the invention can have the simple and composite lead arranged around a suitably shaped center support for chips of any shape.

What is claimed is:

1. The combination of a chip carrier housing and a lead frame, said housing and lead frame being capable of receiving integrated circuit chips in a range of sizes and having varying numbers of terminal pads thereon,
   said lead frame comprising a plurality of leads extending radially from the geometric center of said lead frame, each of said leads having an inner end portion, an intermediate portion, and an outer end portion, said inner end portion of each of said leads being proximate to the center of said lead frame, said outer end portion being remote from said center, and said intermediate portion being between said inner and outer end portions,
   at least one of said leads being a composite lead, said inner end portion of said composite lead comprising a trunk lead and branch leads, said trunk lead extending from said center of said lead frame, said branch leads extending from the side edges of said trunk lead at spaced intervals and at increasing distances from said center of said lead frame,
   said housing comprising a plastic frame-like structure molded onto said intermediate portions of said leads, said frame like structure having oppositely directed faces, external laterally facing sidewall portions and internal sidewall portions, said inner end portions of said leads extending radially from said internal sidewall portions in a plane which is between said oppositely directed faces, and
   a web molded integrally with said frame, said web being between said oppositely directed faces and extending from said internal sidewall portions substantially to said center of said lead frame, said inner end portions of said leads being supported by said web whereby,
   an integrated circuit chip having dimensions which lie within a predetermined range can be packaged in said chip carrier housing by removing a portion of said web and portions of said inner ends of said leads and forming an opening in said web which is dimensioned to receive said chip, and the number of leads available for electrical connections to said chip can be increased by removing portions of said inner end portion of said trunk lead whereby said branch leads become available for electrical connections to said chip.

2. The combination set forth in claim 1, said frame-like structure being square.

3. The combination set forth in claim 2, said lead frame having a support portion at said center, said inner end portions of said leads being integral with, and extending from, said support portion.

4. The combination set forth in claim 1, said lead frame having a plurality of said composite leads, said composite leads extending at equally spaced angular intervals around said center of said lead frame.

5. The combination set forth in claim 4, said lead frame having four of said composite leads, said composite leads being angularly spaced apart by 90 degree intervals.

6. The combination set forth in claim 1, said frame having a support portion at said center, said inner end portion of said leads being integral with, and extending radially from, said support portion, said lead frame having four of said composite leads, said opposite leads being angularly spaced apart by 90 degree intervals.

7. The combination set forth in claim 6, said support portion being square, said composite leads extending from the corners of said support portion.

8. The combination set forth in claim 7, said inner end portions of said leads, other than said composite leads, extending normally from the edges of said support portion, said branch leads extending parallel to said inner end portions of adjacent leads.

9. The combination set forth in claim 8, said frame-like structure being square.

10. A lead frame which is capable of use with solid state chips of varying sizes and having varying numbers of terminal pads, said lead frame comprising:
   a centrally located support member,
   a plurality of leads, said leads having proximate portions which are integral with and which extend from, said support member and having remote portions which are relatively remote from said support member, said remote portions forming a radiating pattern relative to said support member
   at least one of said leads being a fern-like composite lead comprising a trunk lead and branch leads, said branch leads extending from the side edges of said trunk lead at spaced intervals and at increasing distances from said support member whereby, said lead frame can be used in packaging a relatively small solid state chip by removing said support member and connecting said leads, excluding said trunk lead, to the terminal pads in said chip, and said lead frame can be used in packaging larger sizes of chips by removing said support member and portions of said trunk lead which are adjacent to said support member whereby said branch leads can be connected to terminal pads on said chip.

11. A lead frame as set forth in claim 10, said support member being in the geometric center of said lead frame.

12. A lead frame as set forth in claim 11, said lead frame having a plurality of said composite leads which extend from said support member at spaced angular intervals.

13. A lead frame as set forth in claim 12, said support member being rectangular, said lead frame having four of said composite leads, said composite leads extending from the corners of said support member.

14. A lead frame as set forth in claim 13, said support member being square.

15. A lead frame which is capable of use with solid state chips of varying sizes and having varying numbers of terminal pads, said lead frame comprising:
a rectangular support member located in the geometric center of said lead frame, said support member having four side edges and four corners,
integral side edge leads extending from each of said side edges and integral corner leads extending from each of said corners,
each of said side edge leads having a proximate portion and a remote portion relative to said support member, said proximate portions extending normally of said side edges, said remote portions of all of said leads forming a radiating pattern relative to said support member,
said corner leads each being a composite lead comprising a trunk lead which extends obliquely with respect to said proximate portions of the immediately adjacent side edge leads, and each corner lead further comprising branch leads extending from the side edges of said trunk lead, said branch leads extending parallel to said proximate portions of the immediately adjacent side edge leads whereby,
upon removal of said support member, said lead frame will provide a number of leads for terminal pads on a chip equal to the number of said side edge leads plus said four corner leads with said trunk leads serving as said corner leads, and upon removal of said center support and removal of parts of said trunk leads, said branch leads provide additional leads.

16. A stamped lead frame as set forth in claim 15, said support member being square, said corner leads extending at an angle of 45° with respect to said proximate portions of the immediately adjacent side edge leads.

* * * * *